(12) United States Patent
Abadeer et al.

(10) Patent No.: US 7,545,298 B2
(45) Date of Patent: ***Jun. 9, 2009

(54) DESIGN STRUCTURE FOR A DIGITAL-TO-ANALOG CONVERTER USING DUAL-GATE TRANSISTORS

(75) Inventors: Wagdi William Abadeer, Jericho, VT (US); Anthony Richard Bonaccio, Shelburne, VT (US); Joseph Andrew Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/045,055

(22) Filed: Mar. 10, 2008

(65) Prior Publication Data

US 2009/0058704 A1 Mar. 5, 2009

Related U.S. Application Data

(63) Continuation-in-part of application No. 11/846,916, filed on Aug. 29, 2007.

(51) Int. Cl.
*H03M 1/00* (2006.01)
(52) U.S. Cl. .................. 341/135; 330/277; 327/295
(58) Field of Classification Search ......... 341/125–155; 330/277; 327/295
See application file for complete search history.

(56) References Cited

U.S. PATENT DOCUMENTS

| 4,352,092 | A | 9/1982 | Masuda et al. |
|---|---|---|---|
| 4,590,456 | A | 5/1986 | Burton et al. |
| 4,752,900 | A | 6/1988 | Wynne |
| 6,433,639 | B1 * | 8/2002 | Numanami et al. .......... 330/277 |
| 6,617,927 | B2 * | 9/2003 | Numanami et al. .......... 330/277 |
| 6,897,728 | B2 * | 5/2005 | Numanami et al. .......... 330/277 |
| 7,009,441 | B2 * | 3/2006 | Fiedler ....................... 327/295 |
| 7,145,394 | B2 * | 12/2006 | Numanami et al. .......... 330/277 |

OTHER PUBLICATIONS

Solomon et al.; Two Gates are Better Than One; IEEE Circuits & Devices Magazine; Jan. 2003; pp. 48-62.
Office Action (Mail Date: Jul. 29, 2008) for U.S. Appl. No. 11/846,916, filed Aug. 29, 2007; Confirmation No. 1293.

* cited by examiner

*Primary Examiner*—Lam T Mai
(74) *Attorney, Agent, or Firm*—Schmeiser, Olsen & Watts; W. Riyon Harding

(57) ABSTRACT

A design structure embodied in a machine readable medium, the design structure including a current mirror including N stages, each stage comprising $2^{n-1}$ dual gate transistors where N is a positive integer equal to or greater than one and n is an integer between 0 and N−1 for each of the N-stages, values of n being different for each stage of the N stages; an output, every dual gate transistor of each stage of the N stages connected to the output; N inputs, every input of the N inputs connected to a different stage of the N stages, any particular input of the N inputs connected to every dual gate transistor of a stage to which the particular input is connected to; and a current reference circuit, comprising a reference current source and a reference dual gate transistor, each stage of the N stages connected to the current reference circuit.

14 Claims, 3 Drawing Sheets

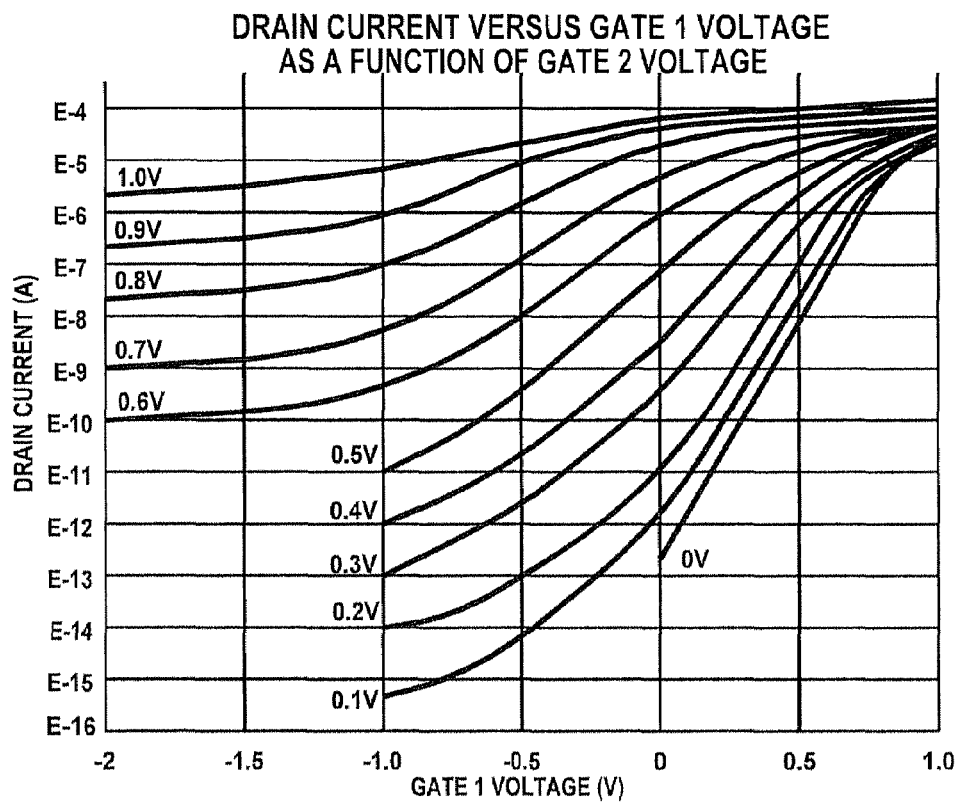
FIG. 2
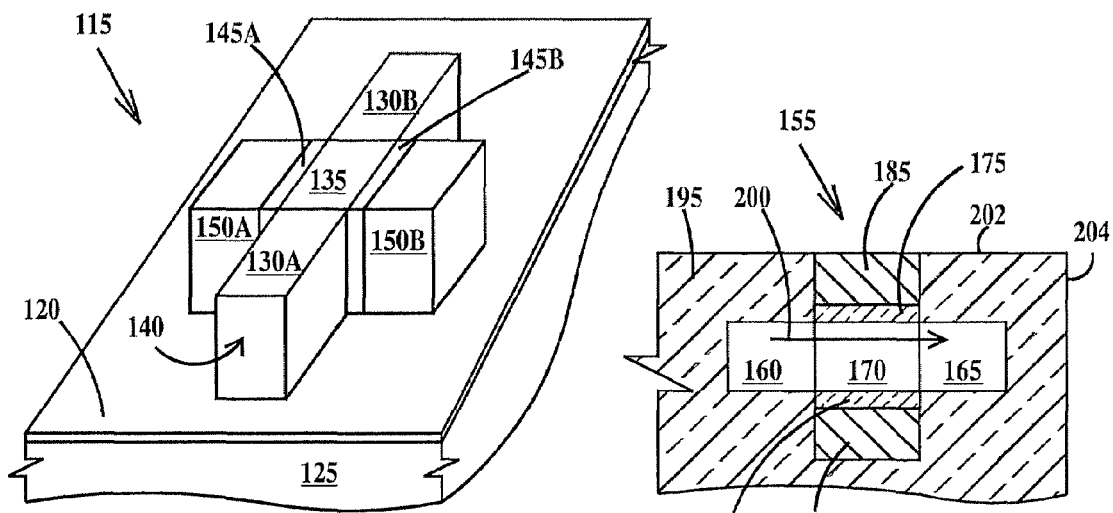
FIG. 3
FIG. 4

DESIGN STRUCTURE FOR A DIGITAL-TO-ANALOG CONVERTER USING DUAL-GATE TRANSISTORS

The present application is a Continuation In Part of copending U.S. patent application Ser. No. 11/846,916 filed on Aug. 29, 2007.

FIELD OF THE INVENTION

The present invention relates to the field of integrated circuits; more specifically, to digital-to-analog converters using dual-gate transistors and to design structures for digital-to-analog converters using dual-gate transistors.

BACKGROUND OF THE INVENTION

Digital-to-analog converter (DAC) circuits are well known in the integrated circuit art. These are circuits that convert a digital word comprising N bits to an equivalent analog signal, typically either voltage or current. One of the most common approaches to implementing a linear DAC on an integrated circuit is what is known as a "current-mode DAC". In this case, the output current is produced by a plurality of binary weighted current sources connected to respective switches whose outputs are, in turn, connected to the common analog output.

Typically, the switches are implemented using CMOS pass gates or CMOS (or bipolar) differential pairs. Since the actual DAC output current flows through the switches, the switches must be sized properly to avoid introducing non-linearity into the DAC transfer function. Most typically, these switch sizes are also binary weighted, each one matching the current mirror group to which it is connected. These switches lead to increased area and reduced performance in the DAC.

Accordingly, there exists a need in the art to overcome the deficiencies and limitations described hereinabove.

SUMMARY OF THE INVENTION

A first aspect of the present invention is design structure embodied in a machine readable medium, the design structure comprising: a current mirror comprising N stages, each stage comprising $2^{n-1}$ dual gate transistors where N is a positive integer equal to or greater than one and n is an integer between 0 and N−1 for each of the N-stages, values of n being different for each stage of the N stages; an output, every dual gate transistor of each stage of the N stages connected to the output; N inputs, each input of the N inputs connected to a different and respective stage of the N stages, any particular input of the N inputs connected to every dual gate transistor of a stage to which the particular input is connected to; and a current reference circuit, comprising a reference current source and a reference dual gate transistor, each stage of the N stages connected to the current reference circuit.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 2 is a plot of drain current versus first gate voltage as a function of second gate voltage for a dual gate finNFET;

FIG. 3 is an exemplary three-dimension diagram of a dual gate finFET;

FIG. 4 is an exemplary cross-section view of a dual gate FET; and

DETAILED DESCRIPTION OF THE INVENTION

In all of the embodiments of the present invention, equation (1) represents the output signal of a DAC:

$$\text{Analog Out} = (X_{\textit{full-scale}}/2^N) * \Sigma(\text{digital bit} n) * 2^n \quad (1)$$

where:

n takes on all integer values between 0 and N−1,

N is the number of bits in the digital input word and the number of stages in the DAC, and $X_{\textit{full-scale}}$ is some full-scale analog value whose units are current.

This transfer function between the digital input bits and the analog output has a familiar shape that looks like a staircase; the "risers" occur at the integer values between 1 and $2^N-1$ and the "treads" are the analog levels given by equation (1).

Figure 1:
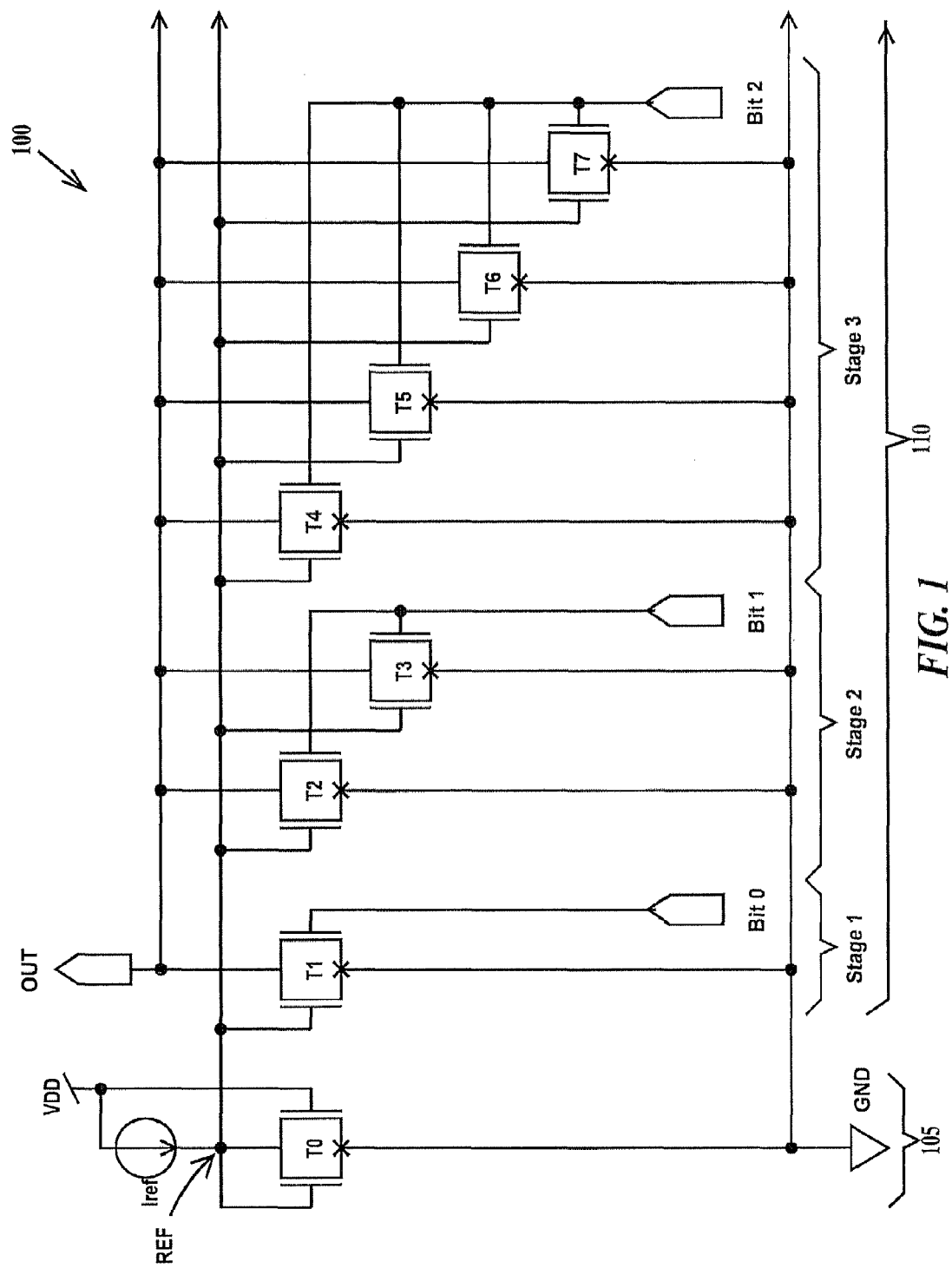
FIG. 1 is a circuit diagram of an exemplary digital-to-analog converter according to embodiments of the present invention.

FIG. 1 is a circuit diagram of an exemplary digital-to-analog converter 100 according to embodiments of the present invention. In FIG. 1, DAC 100 includes a reference circuit 105 and a current mirror/switch 110 arranged in N stages. In FIG. 1, only the first three stages (stage 1, stage 2 and stage 3) of DAC 100 are illustrated. The last stage would be stage N. Reference circuit includes a dual gate transistor T0 and a current source Iref. The three stages of current mirror/switch array 110 illustrated in FIG. 1 include dual gated transistors T1 of stage 0, dual gated transistors T2 and T3 of stage 1 and dual gated transistors T4, T5, T6 and T7 of stage 3. Subsequent stages would have $2^{N-1}$ dual gated transistors, with N being the stage number. So stage 4 would have eight ($2^3$) dual gated transistors, stage 5 would have sixteen ($2^4$) dual gated transistors and so forth to stage N which would have $2^{N-1}$ dual gated transistors. A dual gate transistor is defined as a transistor having two gates on opposite sides of a channel region of a field effect transistor (FET), the gates being electrically isolated from each other.

In a one embodiment of the present invention all dual gated transistors T0 through T7 are n-channel field effect transistors (NFETs) as are all dual gated transistors of stages 4 through N not illustrated in FIG. 1. For the purposes of describing FIG. 1, dual gated transistors T0 through T7 will be described as NFETs. Current source Iref is connected between VDD and a current reference node REF. The drain of dual gate transistor T0 is connected to current reference node REF and the source of dual gated transistor is connected to GND. A first gate of dual gate transistor T0 is connected to current reference node REF and a second gate of dual gate transistor T0 is connected to VDD. The drains of all dual gated transistors T1 through T7 and those of stages 4 through N not illustrated in FIG. 1 are connected to an output pin OUT of DAC 100. The sources of all dual gated transistors T1 through T7 and those of stages 4 through N not illustrated in FIG. 1 are connected to a GND. The first gates of all dual gated transistors T1 through T7 and those of stages 4 through N not illustrated in FIG. 1 are connected to current reference node REF. The second gates of all dual gated transistors T1 through T7 and those of stages 4 through N not illustrated in FIG. 1 are connected to respective input pins Bit 0 through Bit N−1 (input pins Bit 3 through Bit N−1 are not illustrated in FIG. 1) of DAC 100 corresponding to the stage containing the particular dual gated transistor. Thus, in stage 1 the second gate of dual gate transistor T1 is connected to an input pin Bit 0, in stage 2 the second gates of dual gate transistors T2 and T3 are connected to input pin Bit 1, in stage 3 the second gates of dual gate transistors T4, T5, T6 and T7 are connected to input pin Bit 2 and so forth through all the second gates of the dual gate transistors of stage N (not shown) being connected to input pin Bit N−1 (not shown). VDD may be considered as the higher voltage potential terminal and GND the lower voltage potential of a power supply. In one example, VDD is a positive voltage potential and GND is a zero voltage potential.

In one example, when a substantially non-zero gate-to-source voltage is applied to a particular input of the Bit 0 through Bit N−1 inputs, a current flowing through corresponding dual gate transistors increases by at least an order of magnitude over a current flowing through those dual gate transistors when a substantially zero gate-to-source voltage is applied to the particular input.

In an another embodiment of the present invention all dual gated transistors T0 through T7 are p-channel field effect transistors (PFETs) as are all dual gated transistors of stages 4 through N not illustrated in FIG. 1. When dual gated transistors T0 through T7 are PFETs, the connections of the source and drains would be reversed (i.e., for PFETs the sources of all the dual gated transistors are connected to VDD and the drains of all the dual gate transistors are connected to an output pin OUT of DAC 100. This is accomplished by swapping the VDD and GND connection illustrated in FIG. 1, so current source Iref is connected between GND and current reference node REF.

In one example, current source Iref comprises a resistor. In one example current source Iref comprises a PFET. In one example, all dual-gated transistors of DAC 100 are identically designed.

FIG. 2 is a plot of drain current versus first gate voltage as a function of second gate voltage for a dual gate finNFET. A finFET is illustrated in FIG. 3 and described infra. In FIG. 2, the drain current of a dual gate finNFET versus the voltage on the first gate of dual gate finNFET is plotted for various voltages applied to the second gate of the finNFET. It can be seen, for example, by changing the second gate voltage from 0 volts to 1.0 volt while holding the first gate voltage constant at 0.5 volts, a change in drain current of about 3 to about 4 orders of magnitude results. This indicates that the first gate of a dual gated device can be configured (or connected) as in a current mirror and the second gate used as a switch connected to a DAC input pin. In conventional DACs, these functions require different transistors, so the DAC according to the embodiments of the present invention using dual gate transistors reduces the number of transistors required in the switch/mirror section by half with a corresponding reduction in the amount of integrated chip area used by the DAC.

FIG. 3 is an exemplary three-dimension diagram of a dual gate finFET 115. In FIG. 3, dual gate finFET 115 is constructed on a top surface of a dielectric layer 120 formed on a substrate 125. FinFET 115 includes a source 130A and a drain 130B separated by a body region 135, all formed in a silicon fin 140 (e.g., a block of single-crystal silicon). First and second gate dielectric layers 145A and 145B are formed on opposite sidewalls of fin 140 in body region 135. First and second gates 150A and 150B (e.g., polysilicon gates) are formed on respective first and second gate dielectric layers 145A and 145B. For a finNFET, source 130A and drain 130B are doped n-type and body region 135 is doped p-type. For a finPFET, source 130A and drain 130B are doped p-type and body region 135 is doped n-type. First gate 150A is electrically isolated from second gate 150B.

FIG. 4 is an exemplary cross-section view of a dual gate FET. In FIG. 4, a dual gate FET 155 includes a source 160 and a drain 165 separated by a body region 170, Formed on opposite surfaces of body region 170 between source 160 and drain 165 are gate dielectric layers 175 and 180. Formed on respective first and second gate dielectric layers 175 and 180 are first and second gates 185 and 190. For an NFET, source 160 and drain 165 are doped n-type and body region 170 is doped p-type. For a PFET, source 160 and drain 165 are doped p-type and body region 170 is doped n-type. First gate 185 is electrically isolated from second gate 190. FET 155 is surrounded by dielectric isolation 195 on a substrate. As shown in FIG. 4, current flow 200 from source 160 through body region 170 to drain 165 is substantially parallel to a top surface 202 of the substrate, so FET 155 is defined as a vertical dual gated FET. By rotating FIG. 4 90° to the left, current flow 200 from source 160 through body region 170 to drain 165 is substantially perpendicular to a new top surface 204 of the substrate, then FET 155 is defined as a lateral dual gated FET. One difference between dual gated finFETs and vertical and lateral FETs is the fabrication process.

Figure 5:
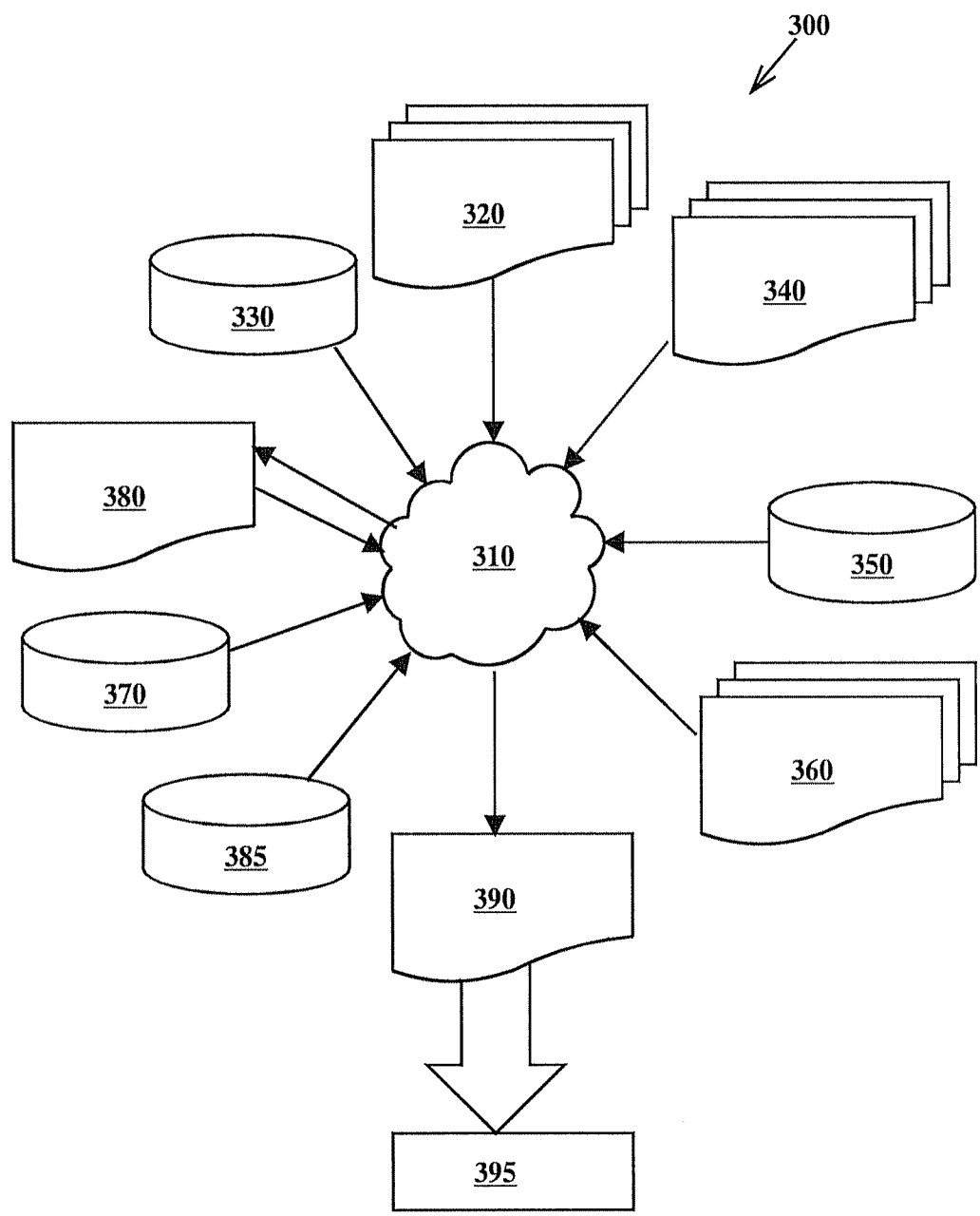
FIG. 5 shows a block diagram of an exemplary design flow 300 used for example, in semiconductor design, manufacturing, and/or test.

FIG. 5 shows a block diagram of an exemplary design flow 300 used for example, in semiconductor design, manufacturing, and/or test. Design flow 300 may vary depending on the type of IC being designed. For example, a design flow 300 for building an application specific IC (ASIC) may differ from a design flow 300 for designing a standard component. Design structure 320 is preferably an input to a design process 310 and may come from an IP provider, a core developer, or other design company or may be generated by the operator of the design flow, or from other sources. Design structure 320 comprises an embodiment of the invention as shown in FIGS. 1, 3 and 4 in the form of schematics or HDL, a hardware-description language (e.g., Verilog, VHDL, C, etc.). Design structure 320 may be contained on one or more machine readable medium. For example, design structure 320 may be a text file or a graphical representation of an embodiment of the invention as shown in FIGS. 1, 3 and 4. Design process 310 preferably synthesizes (or translates) an embodiment of the invention as shown in FIGS. 1, 3 and 4 into a netlist 380, where netlist 380 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 380 is resynthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 30 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIGS. 1, 3 and 4, along with any additional integrated circuit design or data (if applicable), into a second design structure 390. Design structure 390 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 390 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 3 and 4. Design structure 390 may then proceed to a stage 395 where, for example, design structure 390: proceeds to tape-out, is released to manufacturing, is released to a mask house, is sent to another design house, is sent back to the customer, etc.

Thus the present invention provides DACs and DAC design structures that comprise fewer transistors and uses less integrated circuit area than conventional DACs and thus overcome the deficiencies and limitations described supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a machine readable medium that is executable on a computer to design, manufacture, or test an integrated circuit, the design structure comprising:
   a current mirror comprising N stages, each stage comprising $2^{n-1}$ dual gate transistors where N is a positive integer equal to or greater than one and n is an integer between 0 and N−1 for each of said N-stages, values of n being different for each of said N stages;
   an output, every dual gate transistor of each stage of said N stages connected to said output;
   N inputs, each input of said N inputs connected to a different and respective stage of said N stages, any particular input of said N inputs connected to every dual gate transistor of a stage to which said particular input is connected to; and
   a current reference circuit, comprising a reference current source and a reference dual gate transistor, each stage of said N stages connected to said current reference circuit.

2. The design structure of claim 1, wherein said current reference comprises a resistor.

3. The design structure of claim 1, wherein said current reference comprises a PFET.

4. The design structure of claim 1, wherein all dual-gate transistors are identically designed.

5. The design structure of claim 1, wherein all dual-gate transistors are NFETs.

6. The design structure of claim 1, wherein all dual-gate transistors are PFETs.

7. The design structure of claim 1, wherein all dual-gate transistors are finFETs.

8. The design structure of claim 1, wherein all dual-gate transistors are vertical FETs.

9. The design structure of claim 1, wherein all dual-gate transistors are lateral FETs.

10. The design structure of claim 1, wherein:
    all dual-gate transistors are NFETs;
    said current reference is connected between VDD and a reference node;
    a first source/drain and a first gate of said reference dual gate transistor are connected to said reference node;
    a second source/drain of said reference dual gate transistor is connected to ground;
    a second gate of said reference dual transistor is connected to VDD;
    a first source/drain of every dual gate transistor of each stage of each of said N stages is connected to said output;
    a second source/drain of every dual gate transistor of each stage of each of said N stages is connected to ground;
    a first gate of every dual gate transistor of each stage of said N stages is connected to said reference node; and
    a second gate of every dual gate transistor of each stage of said N stages is connected to a respective and corresponding input of said N inputs.

11. The design structure of claim 1, wherein:
    all dual-gate transistors are PFETs;
    said current reference is connected between ground and a reference node;
    a first source/drain and a first gate of said reference dual gate transistor are connected to said reference node;
    a second source/drain of said reference dual gate transistor is connected to VDD;
    a first source/drain of every dual gate transistor of each stage of each of said N stages is connected to said output;
    a second source/drain of every dual gate transistor of each stage of each of said N stages is connected to VDD;
    a first gate of every dual gate transistor of each stage of said N stages is connected to said reference node; and
    a second gate of every dual gate transistor of each stage of said N stages is connected to a respective and corresponding input of said N inputs.

12. The design structure of claim 1, wherein when a substantially non-zero gate-to-source voltage is applied to a particular input of said N-inputs a current flowing through corresponding dual gate transistors increases by at least an order of magnitude over a current flowing through said corresponding dual gate transistors when a substantially zero gate-to-source voltage is applied to said particular input.

13. The design structure of claim 1, wherein the design structure is encoded as data in a netlist data format on said computer readable medium.

14. The design structure of claim 1, wherein the design structure resides on said computer readable storage medium in a data format used for the exchange of layout data of integrated circuits.

* * * * *